(12) United States Patent
Spratte et al.

(10) Patent No.: US 6,590,783 B2
(45) Date of Patent: Jul. 8, 2003

(54) SHIELDED ELECTRONIC CIRCUIT

(75) Inventors: Joachim Spratte, Osnabrück (DE); Jörg Reinhardt, Lahnau (DE)

(73) Assignee: Mannesmann VDO AG, Frankfurt am Main (DE)

(*) Notice: Subject to any disclaimer, the term of this patent is extended or adjusted under 35 U.S.C. 154(b) by 0 days.

(21) Appl. No.: 09/864,690

(22) Filed: May 24, 2001

(65) Prior Publication Data

US 2002/0003695 A1 Jan. 10, 2002

(30) Foreign Application Priority Data

May 27, 2000 (DE) .......................................... 100 26 353

(51) Int. Cl.⁷ ............................................... H05K 9/00
(52) U.S. Cl. ...................... 361/800; 361/816; 361/818; 174/35 R; 174/35 GC
(58) Field of Search ................................ 361/800–802, 361/816, 818, 758, 784, 787, 688, 717; 174/35 R, 91, 35 GC, 35 MS; 257/659, 660, 678, 727

(56) References Cited

U.S. PATENT DOCUMENTS

| | | | | |
|---|---|---|---|---|
| 5,159,537 A | * | 10/1992 | Okano | 361/424 |
| 5,354,951 A | * | 10/1994 | Lange, Sr. et al. | 174/35 R |
| 5,763,824 A | * | 6/1998 | King et al. | 174/35 R |
| 6,269,008 B1 | * | 7/2001 | Hsu | 361/816 |
| 6,377,472 B1 | * | 4/2002 | Fan | 361/800 |
| 6,426,457 B1 | * | 7/2002 | Toyoda et al. | 174/35 R |
| 6,472,724 B1 | * | 10/2002 | Matsuzawa et al. | 257/659 |
| 6,490,173 B2 | * | 12/2002 | Perkins et al. | 361/816 |

FOREIGN PATENT DOCUMENTS

| | | | |
|---|---|---|---|
| DE | 199 21 692 | 5/2000 | H05K/9/00 |
| EP | 0 519 767 | 12/1992 | H05K/9/00 |
| EP | 0 632 686 | 1/1995 | H05K/7/20 |
| EP | 0 926 940 | 6/1999 | H05K/9/00 |
| JP | 10041678 | 2/1998 | H05K/9/00 |

\* cited by examiner

*Primary Examiner*—David Martin
*Assistant Examiner*—Dameon E. Levi
(74) *Attorney, Agent, or Firm*—Cohen, Pontani, Lieberman & Pavane

(57) ABSTRACT

An electronic circuit includes an outer shielding mounted on a main printed circuit board. To prevent electronic components from affecting one another, at least one inner shielding is arranged within the outer shielding. The outer shielding has an opening bounded by spring tongues which rest on the inner shielding.

8 Claims, 1 Drawing Sheet

SHIELDED ELECTRONIC CIRCUIT

BACKGROUND OF THE INVENTION

1. Field of the Invention

The present invention relates to an electronic circuit with an outer shielding and at least an inner shielding within the outer shielding for preventing the electronic components of the electronic circuit from affecting one another.

2. Description of the Related Art

Electronic circuits having a shielding are generally known and customary in technology such as, for example, in motor vehicles for vehicle application apparatus. The shielding protects the electronic components of the electronic circuit against external electromagnetic influence and prevents electromagnetic waves from irradiating outwards from the electronic circuit so the electronic circuit does not disrupt any external electronic devices. Electronic circuits often contain electronic components which may affect one another. For this reason, these circuits require an inner shielding of individual components within the outer shielding of the entire electronic circuit. If the inner shielding is provided within the outer shielding, the conduct of the heat of the electronic components which are doubly shielded in this way causes difficulties. The internal shielding may be connected to the external shielding with thermally conductive rubber so that the heat passing into the internal shielding flows into the outer shielding via the thermally conducting material. However, such a connection of the shieldings via, for example, a thermally conductive rubber entails a relatively high degree of effort in terms of mounting and requires tight tolerances of the components so that excessively differing distances between the two shieldings have to be bridged. Furthermore, the resulting thermal conduction is often inadequate because the heat must first pass from the one shielding into the thermal conductive rubber and then from the thermally conductive rubber into the other shielding before the outer shielding can emit the heat into the ambient air.

SUMMARY OF THE INVENTION

The object of the present invention is to provide a shielded electronic circuit having an outer shielding and an inner shielding such that the heat passing into the inner shielding is conducted away to the outside of the electronic circuit in an optimal way without requiring a highly precise fabrication of the circuit or a complicated mounting.

The object of the present invention is met by providing an outer shielding arranged for resting on an inner shielding and having an opening in the vicinity of the inner shielding.

The configuration of the outer shielding eliminates the actual cause of the problem of poor cooling of the inner shielding, namely the enclosure of the electronic component within the inner shielding by two walls. The inventive opening in the outer shielding allows the inner shielding in the vicinity of the opening to form a part of the wall face of the outer shielding. For this reason, heat from the inner shielding is emitted directly to the outside. Accordingly, the transmission of heat out of the inner shielding into the outer shielding is no longer required.

In practice, considerable fluctuations in the distance between the inner shielding and the outer shielding are possible due to manufacturing tolerances. Accordingly, a compensation for the manufacturing tolerance is required. The compensation is easily realized in one embodiment of the present invention by arranging a plurality of spring tongues arranged next to each other on the outer shielding such that they bound the opening of the outer shielding. The spring tongues are arranged so that they rest under tension on the inner shielding.

To properly shield a component, the gaps between the outer shielding and the inner shielding have to be dimensioned with regard to the wave lengths of the interfering frequencies. This causes difficulties because it is not possible to predict accurately with which regions the outer shielding will rest on the inner shielding. These uncertainties are avoided by arranging spherical impressions on the outer shielding such that the outer shielding rests on the inner shielding along the edge of the opening via the spherical impressions and the distances of the spherical impressions are matched to the wave lengths of the interfering frequencies.

In a further embodiment, the spherical impressions are arranged on the plural spring tongues.

The spring tongues are capable of compensating particularly large differences in the distance if, according to a further embodiment of the present invention, the spring tongues are bent so as to extend in a Z-shape to compensate different relative vertical positions of the inner and outer shieldings.

A particularly good cooling effect and at the same time an overall volume which is as small as possible is obtained if the inner shielding is higher than the outer shielding relative to a main printed circuit board of the electronic circuit and the Z-shaped tongues of the outer shielding are led upward out of the plane of the outer shielding to the plane of the inner shielding.

The electronic circuit is configured optimally as a whole if the outer shielding is mounted on the main printed circuit board, a daughter printed circuit board is fitted within the outer shielding which extends parallel to and at a distance from the main printed circuit board and is fitted with at least one further electronic component, and the inner shielding is mounted on the auxiliary printed circuit board.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In said drawing, wherein like reference characters denote similar elements throughout the several views.

DETAILED DESCRIPTION OF THE PRESENTLY PREFERRED EMBODIMENTS

Figure 1:
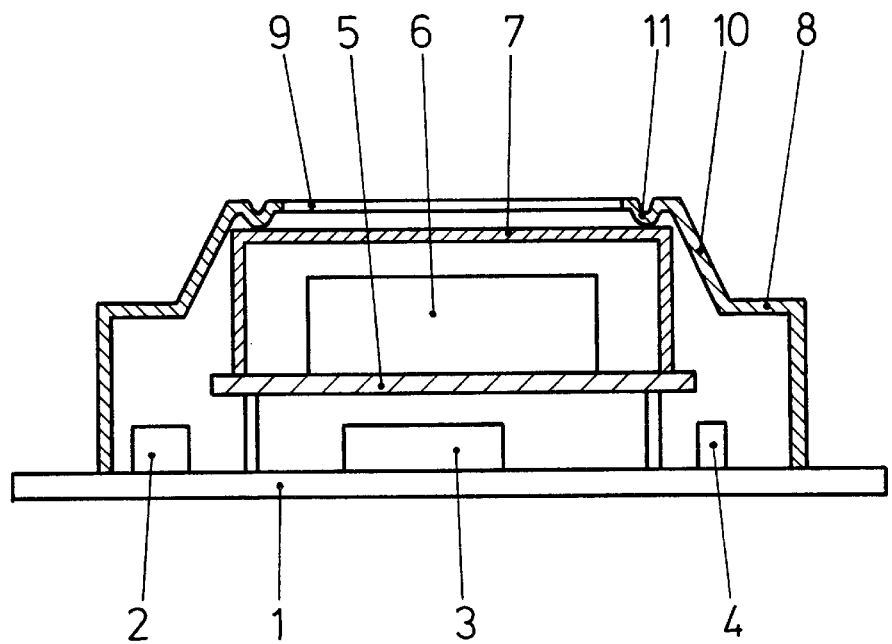
FIG. 1 is a sectional view through an electronic circuit according to the present invention.

A main printed circuit board 1 is shown in FIG. 1 on which various circuit components 2, 3, 4 are arranged. An auxilliary printed circuit board 5 with an electronic component 6 is also mounted on the main printed circuit board 1 at a distance from the main printed circuit board 1 and parallel to the main printed circuit board 1. The electronic component 6 is encapsulated by an inner shielding 7 mounted on the secondary circuit board 5. An outer shielding 8 mounted on the main circuit board 1 covers the entire electronic circuit. The outer shielding has an opening 9 bounded by spring tongues 10 which extend upward from the outer shielding in a Z-shape. Each of the spring tongues 10 includes a spherical impression 11 which rests under tension on an upper side of the inner shielding 7.

Figure 2:
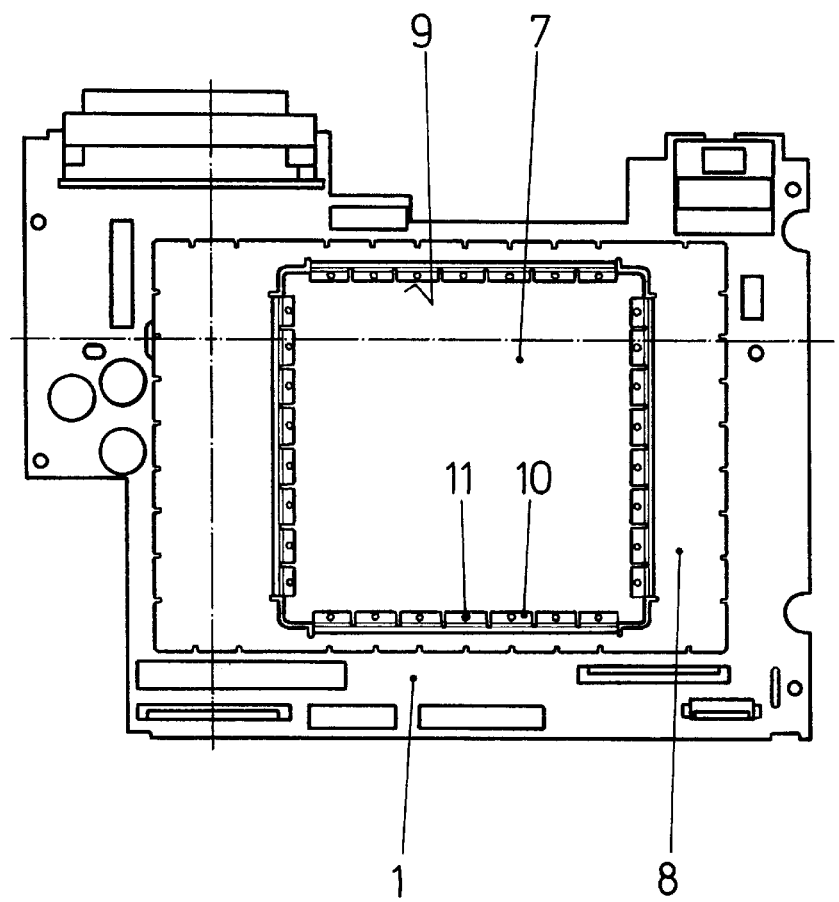
FIG. 2 is a plan view of the electronic circuit of FIG. 1.

FIG. 2 shows the main printed circuit board 1 with the outer shielding 8 arranged on it. Furthermore, the opening 9 bounded by the spring tongues 10 is clearly shown. Each spring tongue 10 rests under tension with its impression 11 on the inner shielding 7.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. An electronic circuit, comprising:
   a plurality of circuit components comprising first and second portions;
   an outer shielding having an opening and arranged for protecting said electronic circuit from external interferences;
   an inner shielding arranged within said outer shielding for preventing said first and second portions of said plural electronic components from interfering with one another, wherein said outer shielding rests on said inner shielding such that said opening of said outer shielding is arranged in a vicinity of said inner shielding so that said inner shielding forms a part of a wall face of the outer shielding;
   a main circuit board on which said outer shield is mounted, said first portion of said circuit components being arranged on said main circuit board; and
   an auxiliary circuit board mounted within said outer shielding on said main circuit board and extending parallel to and at a distance from said main circuit board, said second portion of said circuit components being arranged on said auxiliary circuit board and said inner shielding being mounted on said auxiliary circuit board.

2. The electronic circuit of claim 1, wherein said outer shielding further comprises a plurality of spring tongues bounding said opening in said outer shielding, said plural spring tongues being arranged adjacent to one another and resting under tension on said inner shielding.

3. The electronic circuit of claim 1, further comprising spherical impressions arranged along an edge of said opening of said outer shielding, said impressions being arranged such that distances between said impressions are matched to a wavelength of the interfering frequencies of the electronic circuit, wherein said outer shielding rests on said inner shielding via said spherical impressions.

4. The electronic circuit of claim 3, wherein said outer shielding further comprises a plurality of spring tongues bounding said opening and said impressions are provided in the spring tongues.

5. The electronic circuit of claim 4, wherein said spring tongues are bent so as to extend in a Z-shape to compensate different vertical positions of said inner and outer shieldings.

6. The electronic circuit of claim 5, wherein a plane of said inner shielding is higher than a plane of said outer shielding and said spring tongues of said outer shielding extend upward out of said plane of said outer shielding to said plane of said inner shielding.

7. The electronic circuit of claim 2, wherein said spring tongues are bent so as to extend in a Z-shape to compensate different vertical positions of said inner and outer shieldings.

8. The electronic circuit of claim 7, wherein a plane of said inner shielding is higher than a plane of said outer shielding and said spring tongues of said outer shielding extend upward out of said plane of said outer shielding to said plane of said inner shielding.

* * * * *